United States Patent [19]

Powell

[11] 4,190,849
[45] Feb. 26, 1980

[54] ELECTRONIC-BEAM PROGRAMMABLE SEMICONDUCTOR DEVICE STRUCTURE

[75] Inventor: Michael W. Powell, Mesa, Ariz.

[73] Assignee: Motorola, Inc., Schaumburg, Ill.

[21] Appl. No.: 834,081

[22] Filed: Sep. 19, 1977

[51] Int. Cl.² .................. H01L 29/78; H01L 29/34; H01L 27/10; G11C 11/40
[52] U.S. Cl. .................. 357/23; 357/29; 357/45; 357/54; 357/59; 365/185
[58] Field of Search .......... 357/23, 45, 54, 29; 365/185, 128, 217, 237

[56] References Cited

U.S. PATENT DOCUMENTS

| 3,500,142 | 3/1970 | Kahng | 357/54 |
|---|---|---|---|
| 3,573,753 | 4/1971 | Skelly et al. | 357/29 |
| 3,660,819 | 5/1972 | Frohman-Bentchkowsky | 357/23 |
| 3,721,962 | 3/1973 | Foster et al. | 365/217 |
| 3,736,571 | 5/1973 | Cohen et al. | 357/29 |
| 3,825,946 | 7/1974 | Frohman-Bentchkowsky | 357/54 |
| 3,886,530 | 5/1975 | Huber et al. | 357/29 |
| 4,079,358 | 3/1978 | Arntz | 355/237 |
| 4,087,795 | 5/1978 | Rossler | 357/23 |

OTHER PUBLICATIONS

Davis et al., "Automatic Registration In An Electron-Beam Exposure System", IEEE Int. Electron Devices Meeting (12/76), Tech. Dig. pp. 440–442.
Thornton, *Scanning Electron Microscopy*, Chapman & Hall, London, (1968), pp. 111–114.

*Primary Examiner*—William D. Larkins
*Assistant Examiner*—Gene M. Munson
*Attorney, Agent, or Firm*—John A. Fisher

[57] ABSTRACT

A semiconductor device structure is provided in which an electrically isolated or "floating" conductor is adapted to receive electric charge from an electron beam. The resultant stored charge provides the basis for useful electronic functions such as floating gate MOS read-only-memories.

1 Claim, 9 Drawing Figures

ELECTRONIC-BEAM PROGRAMMABLE SEMICONDUCTOR DEVICE STRUCTURE

BACKGROUND

This invention relates in general to semiconductor devices and in particular to semiconductor device structures which include an electrically isolated conductor which is adapted to receive electric charge from an electron beam.

State of the art developments in semiconductor devices and particularly in high density arrays of semiconductor devices in integrated circuits include numerous examples where stored charge is used to control device operation. One such example is the floating gate transistor described in U.S. Pat. No. 3,660,819, in which avalanche-injection is used to transfer charge to the electrically isolated gate of a field effect transistor. As disclosed in the patent, this semiconductor device structure provides the basis for an electrically alterable read-only-memory. Although this approach has proved useful, integrated circuit arrays of such semiconductor devices are inherently limited because of the spacing requirements associated with avalanche-injection.

Furthermore, during programming of the above device, avalanche-injection from the drain-substrate breakdown is used. The minimum channel length for a driver memory device of the above type is approximately 0.45 μm for a −7.5 volt drain. For smaller channel lengths, a gate oxide breakdown will occur first. If the charging mechanism was other than avalanche-injection, the minimum channel length could be about 0.25 μm for −2.0 volt drain voltage, or even smaller for lower drain voltages. Also, during programming, the X and Y decoder devices in a memory, as above, operate at the programming voltages, e.g. −7.5 volts. At this voltage, the minimum channel length is determined, as above, by drain-substrate breakdown.

To store a maximum charge of $4 \times 10^{12}$ electrons/cm$^2$ during avalanche-injection a gate charging current of about $10^{-7}$ amp/cm$^2$ is necessary for about 100 to 5000μ seconds.

In extremely dense arrays of transistors or other semiconductor device structures, the use of avalanche-injection to create floating gates is not possible because the high voltages required for avalanche-injection cause voltage breakdown between adjacent device regions.

Additionally, with prior art devices as set forth above, only p-channel devices can be programmed without extensive modifications and/or extremely slow programming times.

The avalanche-injection technique stores a limited charge on the floating gate, because the charge injected to the gate alters the surface doping. Eventually, the drain-substrate breakdown is inhibited and the injection stops.

Another developing technology which relates to high density integrated circuit structures is electron beam technology. The advent of computer controlled systems for rapidly positioning electron beams which have extremely small dimensions have made it possible to fabricate very small semiconductor devices. Dimensionally, electron beam fabrication systems can resolve lines and spaces as small as one-half micron. These computer controlled electron beam systems are also adapted for automatic registration so that the system can automatically locate and register on a particular location on a semiconductor wafer. A registration capability of this type makes it possible to preselect any particular region on any particular integrated circuit "chip" on a given semiconductor wafer. Additional details on computer controlled electron beam fabrication systems can be obtained by referring to the Technical Digest of the 1976 International Electron Devices Meeting, Session 18: "Device Technology-Electron Beam Technology and Applications," pps. 431–449.

Electron beams have also been proposed in various schemes for information storage including electrostatic storage on insulators, thermoplastic recording and electron beam exposure of photographic emulsions. One such scheme calls for applying a positive bias voltage to the metal gate of an insulated gate field effect transistor (IGFET) and then bombarding the gate with an electron beam. As a result of the bombardment, a positive charge accummulates in the gate oxide of the IGFET near the semiconductor oxide interface. The charge thus stored controls the conductive state of the IGFET and thereby provides the basis for an IGFET memory circuit. A complete discussion of this type IGFET memory is provided in the Proceedings of the IEEE, Volume 56, No. 2, February 1968, An Electron Beam Activated Switch and Associated Memory, page 158, McDonald and Eberhart. A particular constraint of this approach is that the electron beam voltage must be large enough to ensure complete penetration of the metal gate electrode of the IGFET and the associated oxide layer and the bombardment charge density must be sufficient to charge the oxide to saturation.

SUMMARY

Accordingly, it is an object of this invention to provide an improved method for fabricating high density, small geometry, arrays of semiconductor devices the operation of which can be altered by means of an electron beam.

It is a further object of this invention to provide an improved method for fabricating integrated circuits comprising arrays of floating gate transistors the conductive state of which are determined by using an electron beam to store charge on a floating gate.

Briefly described, the present invention is a method for manufacturing semiconductor devices in which a conductive region is located in proximity to a substrate containing the devices but electrically isolated from the devices and the conductive region is charged with an electron beam to alter the operation of the devices.

DETAILED DESCRIPTION

Figure 1A:
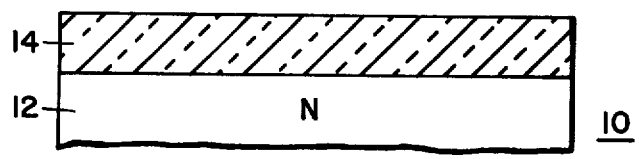
FIG. 1A through FIG. 1E show cross-sectional views illustrating fabrication steps for producing a particular embodiment suitable for practicing the invention.
Figure 1B:
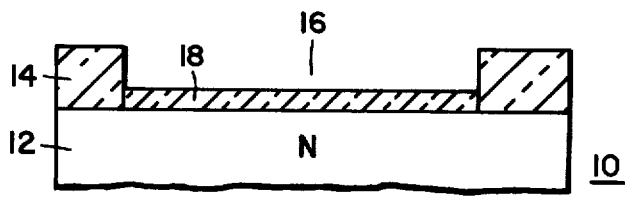
Figure 1C:
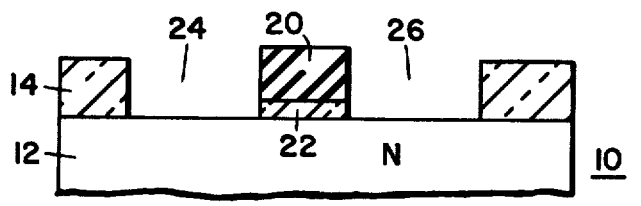
Figure 1D:
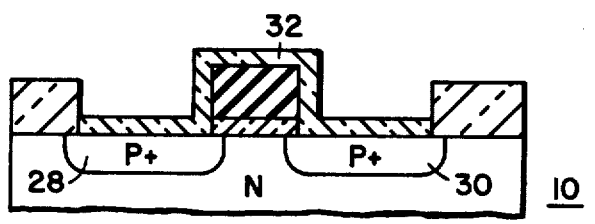
Figure 1E:
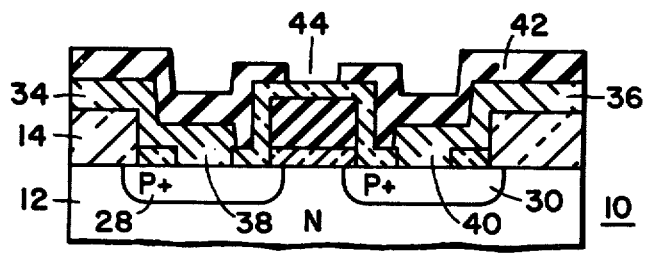

Practice of the present invention requires a semiconductor device embodiment in which an electrically isolated conductor is adapted for charging by an electron beam. FIG. 1A through FIG. 1E show cross-sectional views illustrating the fabrication steps by which such an embodiment can be made. FIG. 1A shows the first step in the fabrication of a device structure 10 in which a N-type substrate or epi layer 12 is provided with an overlying layer 14 of silicon dioxide, which is typically about 5000 angstroms thick. (It should be noted that this description relates to P-channel devices. The instant invention may also be practiced with N-channel devices with a P-substrate.) In FIG. 1B, conventional semiconductor processing techniques are used to define and add source and drain region 16 and then to grow gate oxide layer 18, which is typically about 1000 angstroms thick. FIG. 1C shows device structure 10 after the formation of a polysilicon gate 20, which is formed over a gate oxide region 22 by depositing a layer of polysilicon approximately 5000 angstroms thick over the upper surface of gate oxide layer 18 and then etching to define source and drain regions 24 and 26. FIG. 1D shows the next step in the process in which conventional diffusion and reoxidation steps are used to form P+ diffused regions 28 and 30 by diffusing through the previously described openings 24 and 26. A thermal oxide layer 32, approximately 1000 angstroms thick, is formed coincident with the formation of diffused regions 28 and 30. FIG. 1E shows the final form of semiconductor device structure 10. To attain this final structure, metal regions 34 and 36 are formed to contact diffused regions 28 and 30 through contact openings which are formed in oxide layer 32 at locations 38 and 40 using conventional photomask and etching techniques. Typical procedures for forming metal region 34 and 36 are to deposit 10,000 to 15,000 angstroms of aluminum over the upper surface of the semiconductor device structure and to delineate the metal regions using conventional photomask and etching techniques. After metallization, a passivation layer 42 is formed over the upper surface of semiconductor device structure 10. This layer is conventional except that the final passivation etch process step (normally used to delineate the connection points or "pads" at the periphery of the semiconductor chip) is additionally used to create an opening or window 44 which exposes the upper surface of oxide layer 32 at a location where that oxide layer overlies conductive region 20. The formation of window 44 adapts semiconductor device structure 10 to allow an electric charge to be applied to conductive region 20 using an electron beam.

Semiconductor device structure 10, as shown in FIG. 1E, illustrates one particular embodiment which is adapted to allow altered semiconductor device operation as a result of the application of an electron beam. In this case, metallic region 34 forms an electrical connection to diffused region 38 which functions as the source of a field effect transistor. In a similar fashion, metallic region 36 forms an electrical connection to diffused region 40 which forms the drain of the field effect transistor. Conductive region 20, which in this case is polysilicon, forms an electrically isolated or "floating" gate for the field effect transistor. As is well known for floating gate device of this type, an electric charge stored on the gate will control the conductive or non-conductive state of the device. In conventional devices, this electric charge is stored on the floating gate by avalanche-injection. According to the present invention, semiconductor device 10, as shown in FIG. 1E, differs in that it is adapted to allow the storage of electric charge applied by an electron beam. This difference provides several significant advantages. First, the use of an electron beam means that the location or spacing of the various diffused regions forming semiconductor device 10 are not constrained by the requirements of avalanche injection. As a result, integrated circuits which are of much higher density and which are less expensive to manufacture can be achieved using the electron beam programmable device structure of the present invention. Another significant advantage of the device structure of the present invention is that it can be used to obtain field effect devices which are of either the enhancement mode type or the depletion mode type. This also allows the fabrication of devices using either P-channel or N-channel materials. These useful characteristics are obtained because the semiconductor device structure of the present invention can be adapted such that the electron beam procedure used to store electric charge on the isolated conductor (the floating gate 20 shown in FIG. 1E) results in either positive or negative charging currents. The polarity of the charging current is determined by the thickness of the overlying oxide layer (such as oxide layer 32 shown in FIG. 1D) relative to the energy of the primary electron beam used to apply charge to the isolated conductor. Additional information regarding the energy interrelationships of negative or positive charging currents can be obtained by referring to the textbook, "Scanning Electron Microscopy," by P. R. Thornton, copyright 1968, Chapman and Hall, Ltd., London, pages 111 through 115.

Figure 2:
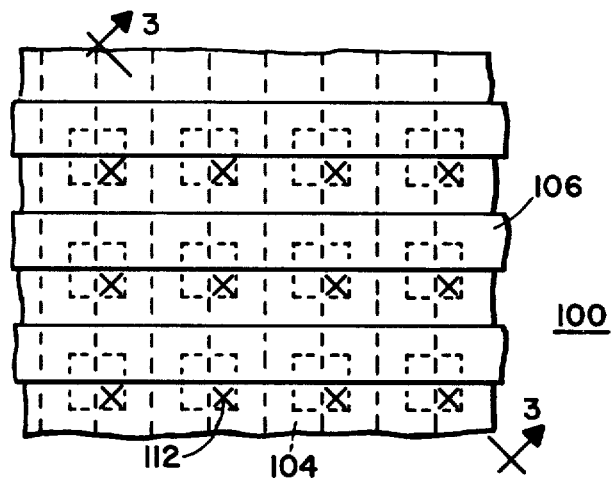
FIG. 2 shows a top view of another particular embodiment suitable for practicing the invention.
Figure 3:
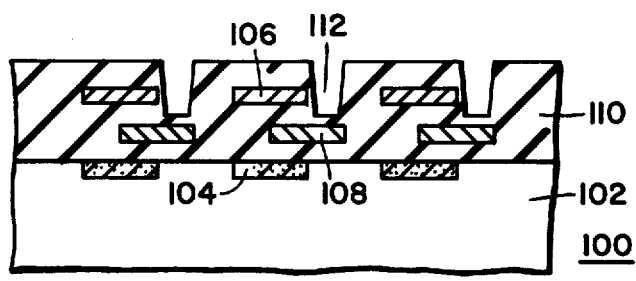
FIG. 3 shows a cross-sectional view of the particular embodiment of FIG. 2.

The elementary semiconductor device structures 10 shown in FIG. 1E provide a building block which can be employed in a wide variety of devices. It is not, however, the only embodiment suitable for practicing the invention as shown by the different embodiments of FIG. 2 and FIG. 3. FIG. 2 shows a schematic top view of a portion of an electron beam programmable storage array 100. FIG. 3 shows a representative cross-sectional view of storage array 100 corresponding to section line X—X' shown in FIG. 2. Storage array 100 comprises a substrate 102 in which there are disposed a plurality of diffused regions such as representative diffused region 104 arranged as a parallel grid. The upper surface of the substrate 102 is covered with an insulating layer upon which a plurality of conductive regions are formed. FIG. 2 and FIG. 3 show a representative conductive region 106. The plurality of conductive regions such as region 106 are arranged as a parallel grid which is generally orthogonal to the parallel grid of diffused regions represented by region 104. Storage array 100 also includes a plurality of conductive elements such as representative element 108. Each of these conductive elements is positioned adjacent to the intersection of diffused region and an overlying conductive region but each of these conductive elements is electrically isolated from each of them as shown by the relative position of representative conductive element 108 in FIGS. 2 and 3. An aperture or window is formed in insulative layer 110 in the vicinity of each of the conductive elements. Thus, FIG. 2 and 3 show a representative aperture 112 formed in conjunction with conductive element 108. The plurality of apertures such as representative aperture 112 adapt storage array 100 for electron beam programming since they provide locations where the thickness of overlying insulative layer 110 is reduced enough to allow electron beam penetration and subsequent storage of electric charge on the conductive elements of the array such as representative element 108. Storage array 100 is a capacitive storage array in which there is an equivalent capacitance formed at each intersection of the orthogonal grids formed by the diffused and the conductive regions. The value of this equivalent capacitance is a function of the electric charge present on the conductive elements present at each intersection. Thus, the use of an electron beam to program the stored charge and to therefore determine the capacitance of each element of the array results in a programmable storage array which has very simple structure. This simple structure allows the fabrication of a very high density array. When electron beam fabrication methods such as those previously referenced are used, it is possible to fabricate a storage array comprising an orthogonal grid of one micron wide diffused regions and one micron wide conductive regions each spaced one micron apart. With such a storage array, one million bits of digital information can be stored in a square storage array region which is 55 mils on each side.

Figure 4:
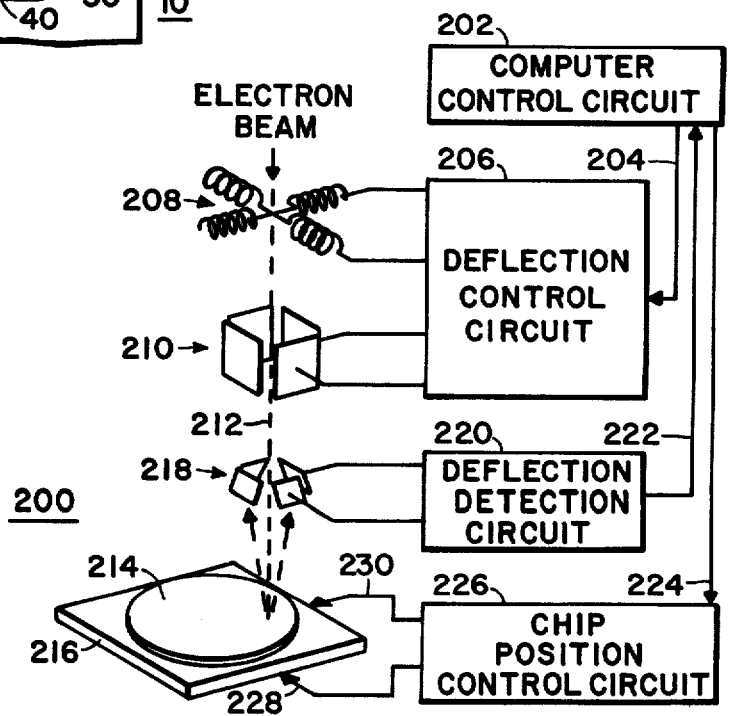
FIG. 4 shows a simplified block diagram of a computer controlled electron beam fabrication system as required for practicing the present invention.

FIG. 4 shows a simplified block and pictoral diagram of a computer controlled electron beam system 200 of the type which would be used to program electron beam programmable semiconductor devices according to the present invention. System 200 comprises a computer control circuit 202 which couples via control link 204 to deflection control circuit 206. Deflection control circuit 206 couples to a magnetic yoke 208 and electrostatic deflection plates 210 which function in combination to focus and position electron beam 212. Electron beam 212 is accelerated by a voltage source (not shown) to impinge on the surface of a semiconductor wafer 214 which is affixed to a movable wafer mount 216. The impinging of electron beam 212 on the surface of wafer 214 produces a backscatter of secondary electrons which are detected by detectors 218 which are coupled to deflection detection circuit 220. Deflection detection circuit 220 functions to produce signals which indicate the position of the electron beam 212. These signals are coupled to computer controller 202 via control link 222. Computer control circuit 202 interprets the received position signals and, in accordance with the algorithm of its stored program, produces control signals on control link 224 which is coupled to chip position control circuit 226. Chip position control circuit 226 produces a X direction control output 228 and a Y direction control output 230 which are coupled as inputs to movable wafer mount 216 and thereby determine the magnitude and direction of its movement.

Figure 5:
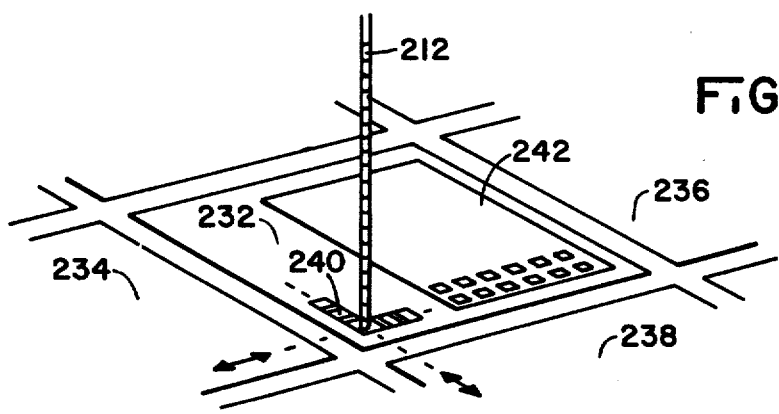
FIG. 5 shows a detailed view of a electron beam registration element as it would be located on a representative chip of the plurality of chips forming a semiconductor wafer.

The operation of the electron beam positioning system shown in FIG. 4 requires that the electron beam be accurately positioned within the periphery of a single one of the plurality of chips which form a semiconductor wafer. The detailed view of FIG. 5 shows how this can be accomplished. In FIG. 5, a particular semiconductor chip 232, which is physically similar to adjacent chips 234, 236, 238, is required to be correctly positioned with respect to electron beam 212. This is accomplished through the use of a registration element 240. The particular shape chosen for registration element 240 guarantees that a unique pattern of back scattered secondary electrons will be produced when registration element 240 is traversed by electron beam 212 in the X direction and in the Y direction. Precise positioning is further determined by insuring that registration element 240 is prealigned with respect to the electron beam programmable elements of the semiconductor devices forming the storage array (designated schematically as array 242 in FIG. 5).

This prealignment is accomplished by fabricating registration element 240 during the same process step as the electron beam programmable elements of the storage array are fabricated. Thus, for the particular case of an array of floating gate field effect devices, registration element 240 would be fabricated by depositing and then etching polysilicon at the same time (and using the same mask) as when the polysilicon "floating gates" were formed.

What is claimed is:

1. An integrated semiconductor device including an insulated gate field effect transistor capable of being selectively programmed by an electron beam for use in a memory array, said transistor comprising: an electrically isolated gate electrode overlying a gate insulator layer which overlies a semiconductor substrate of a first conductivity type and disposed spatially between a source region and a spaced apart drain region of opposite conductivity type which form a pair of PN junctions in said substrate; an insulator layer overlying said gate electrode and being of a thickness to allow penetration of electrons from an electron beam to said gate electrode; a region in said substrate underlying said gate electrode, positioned between said source and drain regions and having a conductive state responsive to electrons stored on said gate electrode from said electron beam; and means on said substrate for accurately positioning said electron beam with respect to said gate electrode.

* * * * *